(12) United States Patent
Hocevar (10) Patent No.: US 7,181,676 B2
(45) Date of Patent: Feb. 20, 2007

(54) LAYERED DECODING APPROACH FOR LOW DENSITY PARITY CHECK (LDPC) CODES

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/056,755

(22) Filed: Feb. 11, 2005

(65) Prior Publication Data

US 2006/0015802 A1 Jan. 19, 2006

Related U.S. Application Data

(60) Provisional application No. 60/589,177, filed on Jul. 19, 2004.

(51) Int. Cl.
*H03M 13/45* (2006.01)

(52) U.S. Cl. .................................................. 714/780
(58) Field of Classification Search ................ 714/780
See application file for complete search history.

(56) References Cited

U.S. PATENT DOCUMENTS

| | | | |
|---|---|---|---|
| 6,539,367 B1 * | 3/2003 | Blanksby et al. ............. 706/14 |
| 6,633,856 B2 * | 10/2003 | Richardson et al. ........... 706/15 |
| 2003/0023917 A1 * | 1/2003 | Richardson et al. ......... 714/749 |
| 2003/0104788 A1 * | 6/2003 | Kim .......................... 455/67.3 |
| 2004/0034828 A1 | 2/2004 | Hocevar |
| 2004/0057575 A1 * | 3/2004 | Zhang et al. ............ 379/399.02 |
| 2004/0194007 A1 | 9/2004 | Hocevar |

OTHER PUBLICATIONS

Mansour, M. M., et al., "Low-Power VLSI Decoder Architecture for LDPC Codes", Proc. ISPLED 2002, pp. 284-289.*
Ping, et al., "Concatenated Tree Codes: A Low-Complexity, High-Performance Approach" Ieee Transactions on Information Theory, vol. 47, No. 2, Feb. 2001.*
Guilloud, R. et al., "-Min Decoding Algorithm Of Regualr And Irregular LDPC Codes," International Symposium On Turbo Codes, Brest, France, Sep. 1-5, 2003, pp. 451-454.
Gunnam, K. et al., "An LDPC Decoding Schedule For Memory Access Reduction," IEEE International Conference On Acoustics, Speech And Signal Processing (ICASSP), Montreal, May 2004, pp. V:173-176.
Jones, C. et al., "Approximate-Min* Constraint Node Updating For LDPC Code Decoding," IEEE Military Communications Conference (MILCOM), Oct. 2003, pp. 157-162.

(Continued)

*Primary Examiner*—Stephen M. Baker
(74) *Attorney, Agent, or Firm*—Steven A. Shaw; W. James Brady; Frederick J. Telecky, Jr.

(57) ABSTRACT

A method of decoding in layers data received in a communication system, comprising receiving a codeword containing a plurality of elements and translating the plurality of elements into probability values by dividing the rows of at least one column of a parity check matrix associated with the codeword into groups and processing at least some of the groups separately.

7 Claims, 5 Drawing Sheets

OTHER PUBLICATIONS

Mansour, M. M., et al., "A Novel Design Methodology for High Performance Programmable Decoder Cores For AA-LDPC Codes," IEEE Workshop On Signal Process Systems (SIPS), Aug. 2003, pp. 29-34.

Olcer, S., "Decoder Architecture For Array-code Based LDPC Codes," IEEE Global Telecomm. Conf. (GLOBECOM), San Francisco, CA., Dec. 2003, pp. 2046-2050.

Rosenthal, J. et al., "Constructions Of Regular And Irregular LDPC Codes Using Ramanujan Grahps And Ideas From Margulis," Proceedings IEEE International Symposium On Information Theory, Washington, D.C., Jun. 2001, p. 4.

Sridhara, D. et al., "Low Density Parity Check Codes From Permutation Matrices," Conference On Information Sciences And Systems., The John Hopkins University, Mar. 2001, one page.

Zhong, H. et al., "Design Of VLSI Implementation-Oriented LDPC Codes," IEEE Vehicular Technical Conference (VTC Fall), Oct. 2003, pp. 670-373.

Hocevar, Dale E., U.S. Appl. No. 11/119,100, filed Apr. 29, 2005, 30 pages, including 3 sheets of formal drawings.

Mohammad M. Mansour, et al., "Low-Power VLSI Decoder Architectures for LDPC Codes," Proceedings ISPLED 2002, pp. 284-289.

* cited by examiner

| | | |
|---|---|---|
| AL: Rd<br>AL: Wr | $X: \hat{L}_j \leftarrow$ BufRd; $T \rightarrow$ BufWr | MAIN PHASE |
| AL: Wr<br>BL: Rd | $X: \hat{L}_j \leftarrow$ BufRd; $T \rightarrow$ BufWr | START/STOP PHASE |
| BL: Rd<br>BL: Wr | $Y: T \leftarrow$ BufRd; $L_j \rightarrow$ BufWr | MAIN PHASE |
| BL: Wr<br>[A1: Rd] | $Y: T \leftarrow$ BufRd; $L_j \rightarrow$ BufWr | START/STOP PHASE |

LAYERED DECODING APPROACH FOR LOW DENSITY PARITY CHECK (LDPC) CODES

CROSS-REFERENCE TO RELATED APPLICATIONS

This application claims priority to U.S. Provisional Application No. 60/589,177, filed Jul. 19, 2004 and entitled, "Improvements to a Layered Decoding Approach for LDPC Codes," which is hereby incorporated herein by reference.

BACKGROUND

One problem that is common to many data communications technologies is the corruption of data due to noise. The signal-to-noise ratio (SNR) for a communications channel is an indication of the quality of the communications carried out over that channel, as it conveys the relative strength of the signal that carries the data (as attenuated over distance and time) to the noise present on that channel. These factors relate directly to the likelihood that a data bit or symbol received over the channel is in error relative to the data bit or symbol as transmitted. This likelihood is reflected by the error probability for the communications over the channel, commonly expressed as the Bit Error Rate (BER) which is a ratio of bits that are received and decoded in error to total bits transmitted. In general, the likelihood of error in data communications should be considered in developing a communications technology. Techniques for detecting and correcting errors in the communicated data should be incorporated for the communications technology to be useful.

To this end, error detection and correction techniques are implemented through the use of redundant coding of the data. In general, redundant coding comprises inserting data bits into the transmitted data stream that do not add any additional information, but that indicate whether an error is present in the received data stream. More complex codes provide the ability to deduce the true transmitted data from a received data stream, despite the presence of errors.

One decoding technique is known as layered decoding. Layered decoding, described in detail below, generally comprises processing the rows of a parity check matrix in groups, or layers. Each layer is processed in successive order, and the processing of each layer is dependent upon data obtained from the processing of an immediately preceding layer. However, these decoder architectures are designed such that there is an inherent data latency between the processing of each layer. For example, to begin processing a layer in a parity check matrix, data obtained by processing the preceding layer must first be obtained. However, this data may not be immediately available; instead, the data may still be in the decoder pipelines, en route to a destination point from which it may be collected to be used for processing. Such data latency causes decoder performance to suffer.

SUMMARY

Some or all of the problems noted above are addressed by improvements to a layered decoding approach for LDPC codes. One exemplary embodiment may comprise receiving a codeword containing a plurality of elements and translating the plurality of elements into probability values by dividing the rows of at least one column of a parity check matrix associated with the codeword into groups and processing at least some of the groups separately.

Another embodiment may comprise receiving a codeword having a plurality of elements, the codeword associated with a parity check matrix having multiple columns and rows, and partitioning at least some rows of at least some columns of the parity check matrix into groups, where each group is processed separately.

Yet another embodiment may comprise a plurality of parallel computation blocks coupled to a memory, a plurality of parity check update blocks (PCUBs) coupled to the computation blocks, and a plurality of column store blocks (CSBs) coupled to the PCUBs, each CSB comprising a memory. The system partitions at least some rows of at least one column of a parity check matrix into groups, wherein the system processes each group separately.

BRIEF DESCRIPTION OF THE DRAWINGS

For a detailed description of exemplary embodiments of the invention, reference will now be made to the accompanying drawings in which:

FIG. 1b shows a submatrix of the parity check macro-matrix of FIG. 1a;

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Further, the notation "⌈ ⌉" denotes a ceiling function.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a modified layered decoding algorithm that removes the data dependencies described above, thus providing a substantial improvement in decoding performance over the known art. Also disclosed is a hardware system that may be used to implement the modified algorithm into any suitable communication system. Specifically, the modified algorithm may comprise partitioning some or all block rows of a parity check matrix into separate groups, each of which is processed independently of the others. Because no single group processes two consecutive block rows of the parity check macro-matrix, the aforementioned data latency problems are reduced or eliminated.

One class of redundant codes is the Low Density Parity Check (LDPC) code. According to this class of codes, a sparse matrix H defines the code, with the encodings, or codewords, c of the payload data (i.e., data to be transmitted) satisfying:

$$Hc=0 \qquad (1)$$

over Galois field GF(2). Each codeword c consists of the source message s combined with the corresponding parity check bits for that source message s. The encodings c are transmitted, with the receiving network element receiving a signal vector r=c+n, n being the noise added by the channel. Because the decoder at the receiver knows matrix H, it can compute a vector z=Hr. However, because r=c+n, and because Hc=0:

$$z=Hr=Hc+Hn=Hn \qquad (2)$$

The decoding process thus involves finding the sparsest vector x that satisfies the equation:

$$Hx=z \qquad (3)$$

over GF(2). The vector x becomes the best guess for noise vector n, which can be subtracted from the received signal vector r to recover encodings c, from which the original source message s is recoverable.

High-performance LDPC code decoders generally are difficult to implement into hardware. While Shannon's adage holds that random codes are good codes, it is regularity that allows efficient hardware implementation. To address this difficult tradeoff between code irregularity and hardware efficiency, the technique of belief propagation provides an iterative implementation of LDPC decoding that can be made somewhat efficient. Belief propagation decoding algorithms are also referred to as probability propagation algorithms, message passing algorithms, and as sum-product algorithms.

Iterative belief propagation algorithms are based on the binary parity check property of LDPC codes. The product of the correct LDPC code word vector with each row of the parity check matrix is zero. According to the belief propagation approach, the received data are used to represent the input probabilities at each input node (i.e., "bit node") of a bipartite graph having input nodes and check nodes. Within each iteration of the belief propagation method, bit probability messages are passed from the input nodes to the check nodes, updated according to the parity check constraint, with the updated values sent back to and summed at the input nodes. The data is typically represented as log likelihood ratios (LLRs) defined as:

$$L(c) = \log\left(\frac{P(c=0)}{P(c=1)}\right) \qquad (4)$$

where c is a coded bit received over the channel.

In its conventional implementation, the belief propagation algorithm uses two value arrays, a first array L storing the LLRs for j input nodes, and the second array R storing the results of m parity check node updates, with m being the parity check row index and j being the column (or input node) index of the parity check matrix H. The general operation of this conventional approach determines, in a first step, the R values by estimating, for each check sum (row of the parity check matrix) the probability of one input node value from the other inputs used in that checksum. The second step of this algorithm determines the LLR probability values of array L by combining, for each column, the R values for that input node from parity check matrix rows in which that input node participated. A "hard" decision is then made from the resulting probability values, and is applied to the parity check matrix. This two-step iterative approach is repeated until (1) is satisfied (all parity check rows equal zero, GF(2)), or until another convergence criteria is reached, or a terminal number of iterations have been executed. LDPC decoding is discussed in further detail in commonly assigned U.S. application Ser. No. 10/329,597, entitled, "Hardware-Efficient Low Density Parity Check Code For Digital Communications," Publication No. US 2004/0034828 A1, which is incorporated herein by reference.

My application Ser. No. 10/329,597, mentioned above, describes a low density parity check (LDPC) code that is particularly well adapted for efficient hardware implementation in a belief propagation decoder circuit. Specifically, the LDPC code is arranged as a macro-matrix whose rows and columns represent block rows and block columns of a corresponding parity check matrix. Each zero entry corresponds to an all-zero submatrix of dimensions p×p. Conversely, each non-zero entry corresponds to a permutation submatrix of dimensions p×p, such as a cyclically shifted identity matrix, with the shift corresponding to the position of the permutation submatrix entry in the macro-matrix. Thus, the macro-matrix serves as a form of "shorthand notation" for the parity check matrix. The columns of the macro-matrix are grouped, so that only one column in the macro-matrix group contributes to the parity check sum in any given row. The decoder circuitry includes a parity check value estimate memory which may be arranged in banks that can be logically connected in various data widths and depths. A parallel adder generates extrinsic estimates that are applied to parity check update circuitry for generating new parity check value estimates. These parity check value estimates are stored back into the memory, and are forwarded to bit update circuits for updating of probability values for the input nodes.

One approach toward iterative decoding is known as "layered decoding," in which the parity check matrix described above may be viewed as a collection of horizontal layers, or rows, and each layer may represent a component code. Layered decoding is performed by applying the decoding algorithm to each successive layer. Performing the decoding algorithm for a particular layer comprises using calculations obtained by decoding previous layers. Because the layered decoding algorithm may be performed using a parallelized decoding hardware, and more particularly because the layered decoding algorithm is substantially different from the conventional belief propagation algorithm, decoding performance may be superior to that of decoding processes not using the layered decoding algorithm and/or parallelized decoding hardware.

Figure 1A:
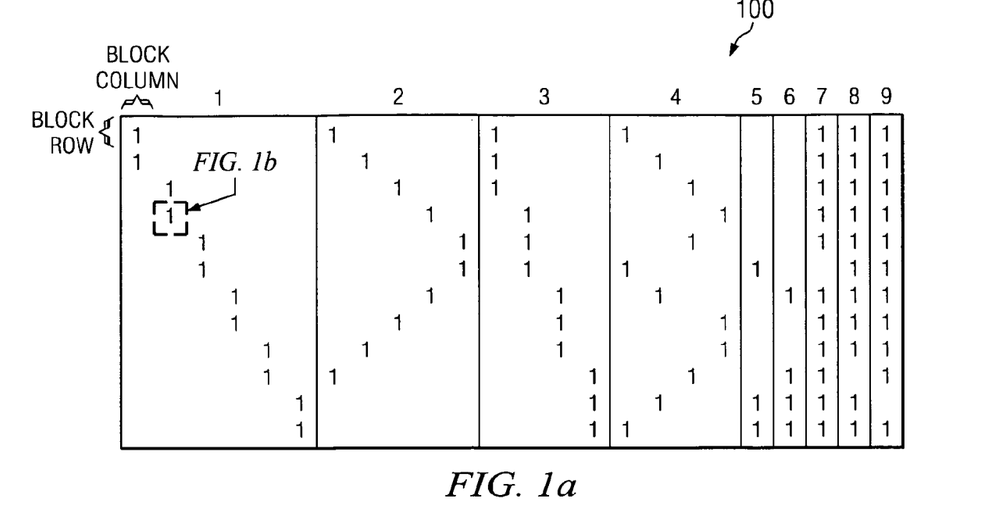
FIG. 1a shows a parity check macro-matrix.
Figure 1B:
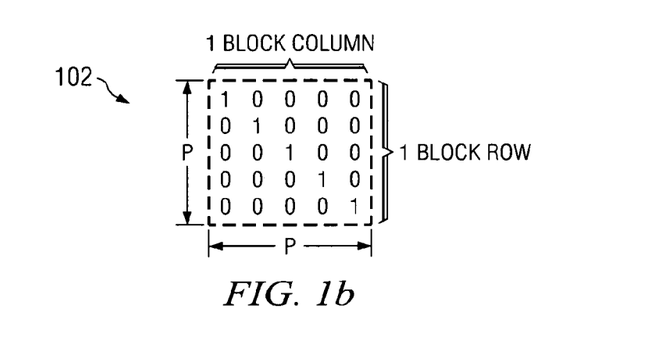

The belief propagation algorithm described above may be performed in a layered decoding mode, as shown by (5)–(11) below. The rows of the parity-check matrix are grouped into non-overlapping subsets, where each column in each subset has a maximum weight of one; that is, each column in each subset has a maximum of one entry. In FIG. 1a, for example, layered decoding can be performed by taking each row of the parity check macro-matrix 100, consisting of p rows, as a layer in the decoding process. Each subset is processed as a unit, and the subsets are processed one after another, using results from the previous subset. Each "1" entry in the matrix 100 represents a p×p submatrix 102, shown in FIG. 1b, that is preferably a cyclically shifted identity matrix. Each "0" (i.e., blank) entry in the matrix 100 represents a p×p submatrix that is full of zero entries.

Essentially, layered decoding comprises using (5)–(11) below to determine the values of the received codeword c as they were prior to transmission. The codeword that is actually received consists of fractions (e.g., multivalued entries or soft data) instead of binary bits. In general, the fractions are used to calculate an array R containing an $R_{mj}$ value that corresponds to each entry of the parity check matrix. These $R_{mj}$ values are combined, by column, to form a vector L. The entry values $L(q_j)$ of the vector L represent the mathematical probabilities that each entry of the received codeword was originally a binary "0" bit or "1" bit prior to transmission. Accordingly, a vector c having binary bits is determined. Each entry of vector c corresponds to an entry of the vector L. For example, if a first entry of vector L contains a value indicating that that entry was a "0" bit prior to transmission, then the first entry of vector c may be assigned a "0" bit. Likewise, if the entry value of the fourth entry of the vector L indicates that the entry was most likely a "1" prior to transmission, then the fourth entry of the vector c may be assigned a "1." The accuracy of the decoding is then determined by verifying that (1) is true for the vector c and the parity check matrix H. If it is true, the vector c has been recreated on the receiver side as it was transmitted on the transmitter side. If (1) is not true, then another iteration of the process is executed. The process may end upon satisfying any of a variety of conditions, such as after completing a predetermined number of iterations or after determining (1) to be true.

Mathematically, the process begins with an initialized estimate for the LLRs $L(q_j)$, $\forall j$, using multivalued, received soft data. Typically, for additive white Gaussian noise (AWGN) channels, this initial estimate is $-2r_j/\sigma^2$, where $\sigma^2$ represents the noise of the channel. The per-row (or extrinsic) LLR probabilities are then derived:

$$L(q_{mj})=L(q_j)-R_{mj} \quad (5)$$

for each column j of each row m of the checksum subset. These per-row probabilities amount to an estimate for the probability of the input node value, excluding the contribution to the estimate from the row itself. In at least some embodiments, one can then derive a value $A_{mj}$ and a sign value $s_{mj}$ as shown in (6) below. The scope of disclosure is not limited to the equations given in (6)–(10); any portion of (6)–(10) may be substituted with any other suitable operation or approximation. Further, all of (6)–(10) may be completely replaced with an alternate, suitable algorithm:

$$A_{mj} = \sum_{n \in N(m); n \neq j} \Psi(L(q_{mn})) \quad (6)$$

While one may use any one of a number of computational forms for (6), or any other suitable computation/approximation technique besides (6) and variations thereof, an example of the function 4J according to a preferred embodiment of this invention is:

$$\Psi(x) \equiv \log(|\tan h(x/2)|) = \log(\tan h|x/2|) \quad (7)$$

The function ψ is its own negative inverse: $\psi(\psi(x))=-|x|$. For computational ease, one can express tanh(L/2) as:

$$\tanh\left(\frac{L}{2}\right) = \left(\frac{e^L - 1}{e^L + 1}\right) \quad (8)$$

The sign is determined from:

$$s_{mj} = \prod_{n \in N(m); n \neq j} \text{sgn}(L(q_{mn})) \quad (9)$$

which is an odd/even determination of the number of negative probabilities, excluding each column's own contribution. The updated estimate of each value $R_{mj}$ becomes:

$$R_{mj} = -s_{mj}\Psi(A_{mj}) \quad (10)$$

The negative sign preceding the $S_{mj}$ term in (10) is intentionally included because the function ψ is its own negative inverse. The value $R_{mj}$ thus corresponds to an estimate of the LLR for input node j as derived from the other input nodes in the mth row of the parity check matrix, not using the value for input node j itself.

In the second step of each decoding iteration, the LLR estimates for each input node are updated. According to the preferred embodiment of this invention, this is performed over each column (i.e., each input node) as follows:

$$L(q_j)=L(q_{mj})+R_{mj} \quad (11)$$

where the estimated value $R_{mj}$ is the most recent update, from equation (10) in this derivation. This column estimate will be used in the hard decision check. This is in contrast to the value of $R_{mj}$ that is used in equation (5) for this iteration, which is the value that was generated from the previous iteration over this subset of parity check matrix H.

The determination of whether the iterations have converged to an error free decoding is based on the per-column LLRs $L(q_j)$:

$$L(q_j) \geq 0, \Rightarrow c_j = 0 \quad (12a)$$

$$L(q_j) < 0, \Rightarrow c_j = 1 \quad (12b)$$

The codeword vector $c=\{c_0, c_1, \ldots c_N\}$ is then applied to the parity check matrix H to determine if the product is zero, which as noted above indicates that codeword vector c is a valid codeword, from which the payload data portion can be readily extracted. Layered decoding is discussed in further detail in the commonly assigned U.S. patent application "Layered Low Density Parity Check Decoding For Digital Communications," Ser. No. 10/806,879, which is incorporated herein by reference.

As previously mentioned, a parity check macro-matrix comprises multiple rows and columns. Each entry in the macro-matrix represents a submatrix of dimensions p×p in a parity check matrix. Thus, each row of the macro-matrix represents p rows in the parity check matrix, and each column of the macro-matrix represents p columns in the parity check matrix. These p rows collectively form a block row (i.e., a layer), and the p columns collectively form a block column. In algorithms employing layered decoding techniques, each of the layers of a parity check matrix, comprising p rows, is processed in successive order. Processing of each layer is dependent upon results obtained by processing the previous layer. Each entry in a parity check macro-matrix represents a submatrix of dimensions p×p. The sub-matrix size p and the parallelization factor z determine the minimum possible processing time for each layer as $\lceil p/z \rceil$ cycles, assuming that z rows generally are processed in each cycle. However, there exist data and/or processing latencies involved with moving z rows or columns of data through the components of a decoder. In general, there may be data pipeline delays throughout various hardware layers in the decoder, because it may not be possible to push the data through at least some of the components of the decoder in a single clock cycle. As previously mentioned, layered decoding necessitates that each layer to be decoded has a data dependency upon the previous layer. Thus, before decoding a current layer, a component of the decoder would be forced to wait for the completion of the previous layer, so that data from the previous layer may be available for use during the decoding of the current layer. Accordingly, the effective time per layer is the overall data latency per layer and the minimum cycle time of $\lceil p/z \rceil$. The layer processing time (i.e., cycle time) has increased by the amount of the data latency. This data latency may have a substantial, negative impact on the throughput of the decoder.

For example, referring to the parity check macro-matrix 100 of FIG. 1a, when a non-zero entry occurs immediately below another non-zero entry, including the case of circular wrapping of the last row back to the first row, the data dependency problem discussed above may occur. The data dependency problem results because the data necessary for processing a particular column in a particular row may not be available, as discussed above. In vertical column groupings 1, 3, 5, 6, 7, 8 and 9 of macro-matrix 100, this data dependency problem may occur in every column. In groupings 2 and 4, the data dependency problem only occurs in the last two columns.

As described above, each component $L(q_j)$ of the vector L is an accumulation of the most recent $R_{mj}$ terms, as this is accomplished by removing each previous $R_{mj}$ term in (5) and adding the updated term in (11) as the term becomes available. If the term is not available, there is a data dependency problem. This data dependency problem is removed for a column j by partitioning a single $L(q_j)$ accumulation into two separate accumulations (i.e., groups), labeled A and B relative to this jth column and described in further detail below. Each of the block rows also may be labeled A or B. In a preferred embodiment, the block rows of each block column may be labeled differently from the block rows of another block column. For a given column j, block rows labeled A may be associated with the A accumulation and block rows labeled B may be associated with the B accumulation. Any suitable, alternative labeling scheme also may be used.

In at least some embodiments, accumulation A will include terms from those block rows labeled as A; accumulation B will include terms from those block rows labeled as B. Thus, for each column of a parity check matrix, the $L(q_j)$ accumulations A and B may respectively be written as:

$$L_{Aj} = \hat{L}_j - \hat{R}_{A1j} + R_{A1j} - \ldots - \hat{R}_{ALj} + R_{ALj} \quad (13)$$

$$L_{Bj} = \hat{L}_j - \hat{R}_{B1j} + R_{B1j} - \ldots - \hat{R}_{BLj} + R_{BLj} \quad (14)$$

Each of (13) and (14) effectively comprises the calculations performed by (5) and (11). In at least some embodiments, (13) is used only for rows labeled A, and (14) is used only for rows labeled B. The $\hat{R}_{mj}$ terms correspond to the terms in (5) that are taken from the immediately preceding iteration. The $R_{mj}$ terms correspond to the recently determined terms from (10) that are used in (11). For a column j, the sequence of indices A1j through ALj refer to rows in the A labeled block rows that contribute as defined by the parity check matrix. Similarly, the sequence of indices B1j through BLj refer to rows in the B labeled block rows that contribute as defined by the parity check matrix. The term $\hat{L}_j$ is the initial value of the L variable for this column j at the start of the iteration; its value is determined by (15) below.

At the end of each iteration, for a particular column j, $L_{Aj}$ and $L_{Bj}$ may be combined to form a single term that corresponds to the overall $L(q_j)$ term. This term may be labeled $L_j$ and is computed as:

$$L_j = L_{Aj} + L_{Bj} - \hat{L}_j \quad (15)$$

This $L_j$ may then be used in the next iteration after being relabeled as $\hat{L}_j$.

In some cases of at least some embodiments, this modified algorithm causes block rows A and B to be processed alternately with respect to a column j. However, block rows A and B are not necessarily processed in an alternating manner; any processing order may be used. The data latency problem is eliminated because, through appropriate selection of accumulations A and B, consecutive block rows of the parity check matrix never occur in the computation of either $L_{Aj}$ or $L_{Bj}$. In at least some embodiments, additional groups may be used, such as groups A, B and C. Thus, instead of grouping block rows into two separate accumulations, block rows may be grouped into three or more separate accumulations. These accumulations may be processed in a manner similar to that used for two accumulations.

Figure 2:
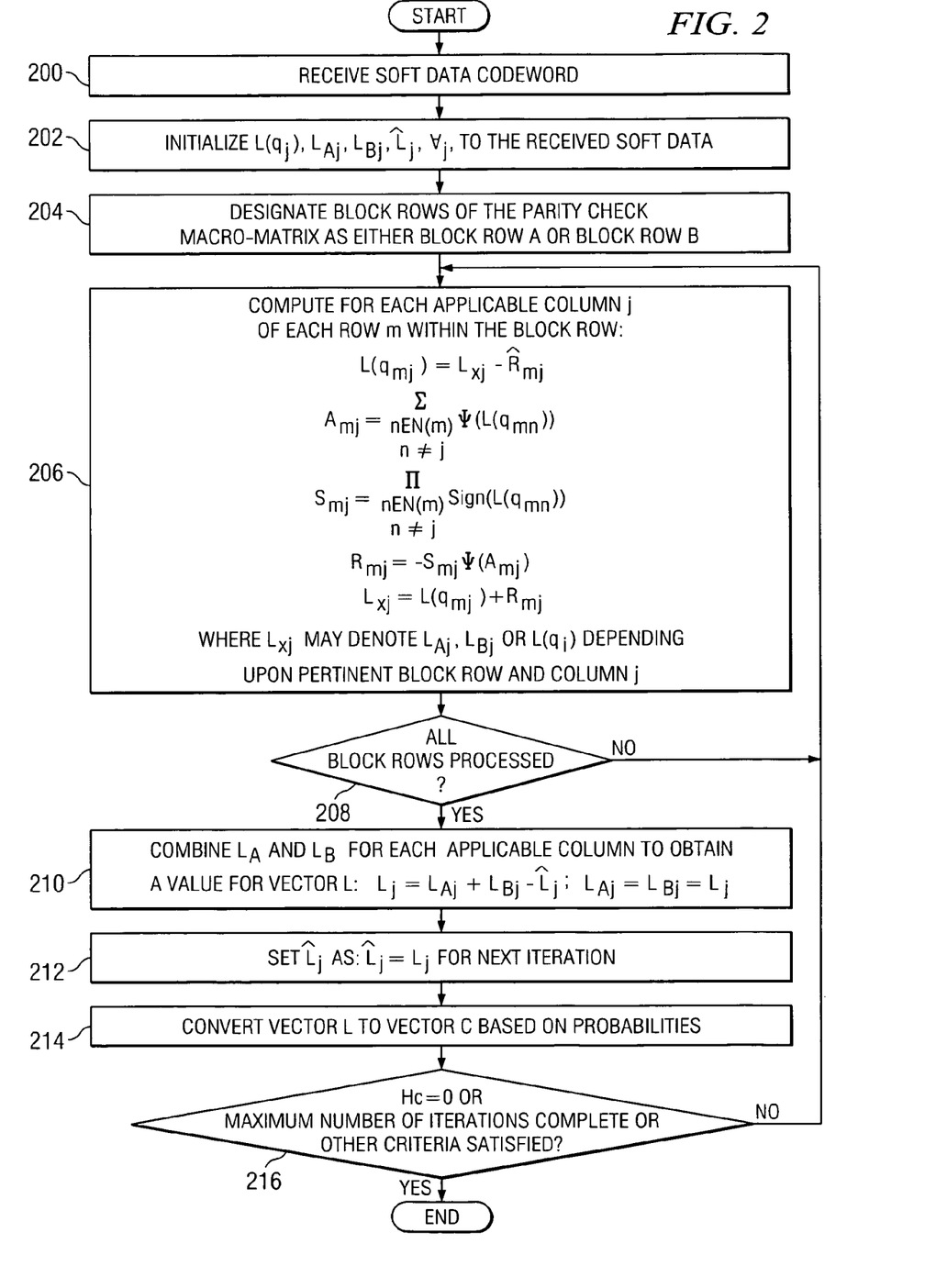
FIG. 2 shows a flow diagram in accordance with embodiments of the invention.

FIG. 2 shows a flow diagram describing the modified algorithm. The process may begin by receiving a codeword containing soft-data (block 200). Then $L(q_j)$, $\hat{L}_j$, $L_{Aj}$ and $L_{Bj}$, for some or all columns j, may be initialized to the received soft data (block 202). For at least one column, but not necessarily all columns, block rows may be designated as A or B, as described above (block 204). In at least some embodiments, however, such designations may be performed while designing hardware that performs the algorithm. The modified algorithm is then computed for at least some columns j of at least some rows m within at least some of the block rows, as in (6), (9) and (10) (block 206). As shown in block 206, the symbol $L_{xj}$ may be used to denote $L_{Aj}$, $L_{Bj}$, or $L(q_j)$, depending on the pertinent block row and whether the pertinent column j is employing this multiple-accumulation technique. Alternate and substantially equivalent algorithms, operations and/or approximations may be used in place of (6), (9) and (10). Within block 206, before (6) is computed, the term $L(q_{mj})$ is first updated using $L_{xj}$ and the value of $\hat{R}_{mj}$, which is from a previous iteration. In an initial iteration, however, a value of zero may be substituted for $\hat{R}_{mj}$, since no previous iterations exist. Within block 206, after (10) is computed, $L_{xj}$ is updated using the value of $L(q_{mj})$ calculated prior to (6) and the value of $R_{mj}$ from the current iteration.

If all block row processes 208 have been processed, then the process may proceed; otherwise, another block row is processed (block 208). In block 210, $L_{Aj}$ and $L_{Bj}$ then are combined for each applicable column to obtain a value for vector L as in (15). Also in block 210, the values of $L_{Aj}$ and $L_{Bj}$ are set to the value of $L_j$. The $L_j$ values for applicable columns j are converted to $\hat{L}_j$ values to obtain a vector L (block 212), which is then converted to a bit vector c based on the probabilities of vector L (block 214). It should be understood that the notation for $L_j$, $L(j)$ and $L(q_j)$ are interchangeable. Each of these three terms describes values of the vector L for a particular column j. After vector c has been determined in block 214, if (1) is not satisfied, or if a maximum number of iterations is not complete, or no other criteria have been satisfied, the process may be repeated; otherwise, the process is complete (block 216).

Figure 1C:
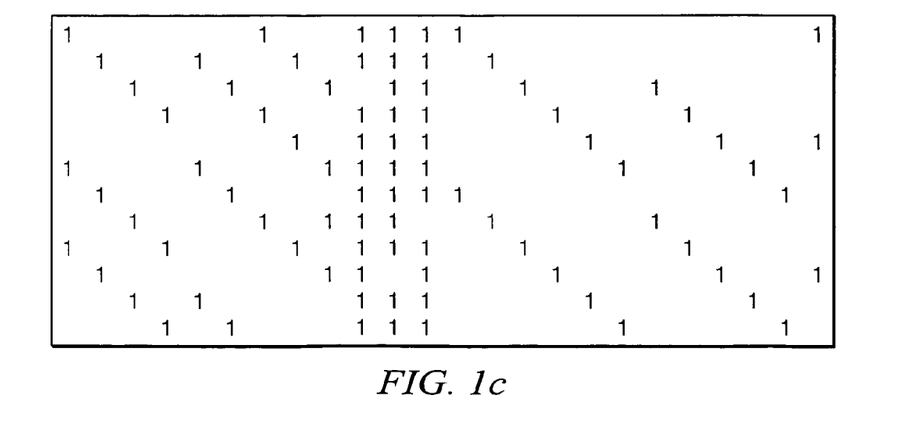
FIG. 1c shows the parity check macro-matrix of FIG. 1a with entries rearranged in accordance with embodiments of the invention.

The modified algorithm may have a negative effect on the achieved error rates. This negative effect may be minimized by designing the parity check macro-matrix so that the number of columns for which this problem may occur is minimized, thus reducing the number of columns to which the modified algorithm need be applied. For example, the macro-matrix 100 of FIG. 1a has 17 columns for which the data latency problem may occur. Redesigning the macro-matrix 100 as shown in FIG. 1c, such that only three of the 24 total columns have the data latency problem, causes the error degradation to be generally negligible. Such a redesign also means that the modified algorithm presented above need only be implemented for a few columns; the remaining columns may use any suitable algorithm, including the modified algorithm above.

An extra calculation (15) and updates associated therewith are present in the modified algorithm that are not present in other known algorithms. This calculation and its associated updates introduce a degree of inefficiency to the algorithm, since additional time is required to perform them. To minimize such inefficiencies, the calculation and, in some embodiments, its updates preferably may be performed during a time gap in which the processor is not performing any calculations for the relevant column of the parity check matrix. One such type of time gap may be found in parity check macro-matrix columns that have at least one zero as an entry. Specifically, if other columns sharing the same row as the zero entry have non-zero entries, then the processor may be performing algorithms on those non-zero entries. Because layered decoding necessitates performing algorithms on most or all columns of a row at approximately the same time, the zero entry effectively serves as an "idle" point during which no calculations are being performed for that particular column. Instances of such time gaps or idle points may be used to compute (15). Because (15) is computed during a time period which would otherwise go unused, there is no extra time required to compute (15) and efficiency is positively affected. In some embodiments, the calculation of (15) may be altogether skipped for several iterations.

Figure 3:
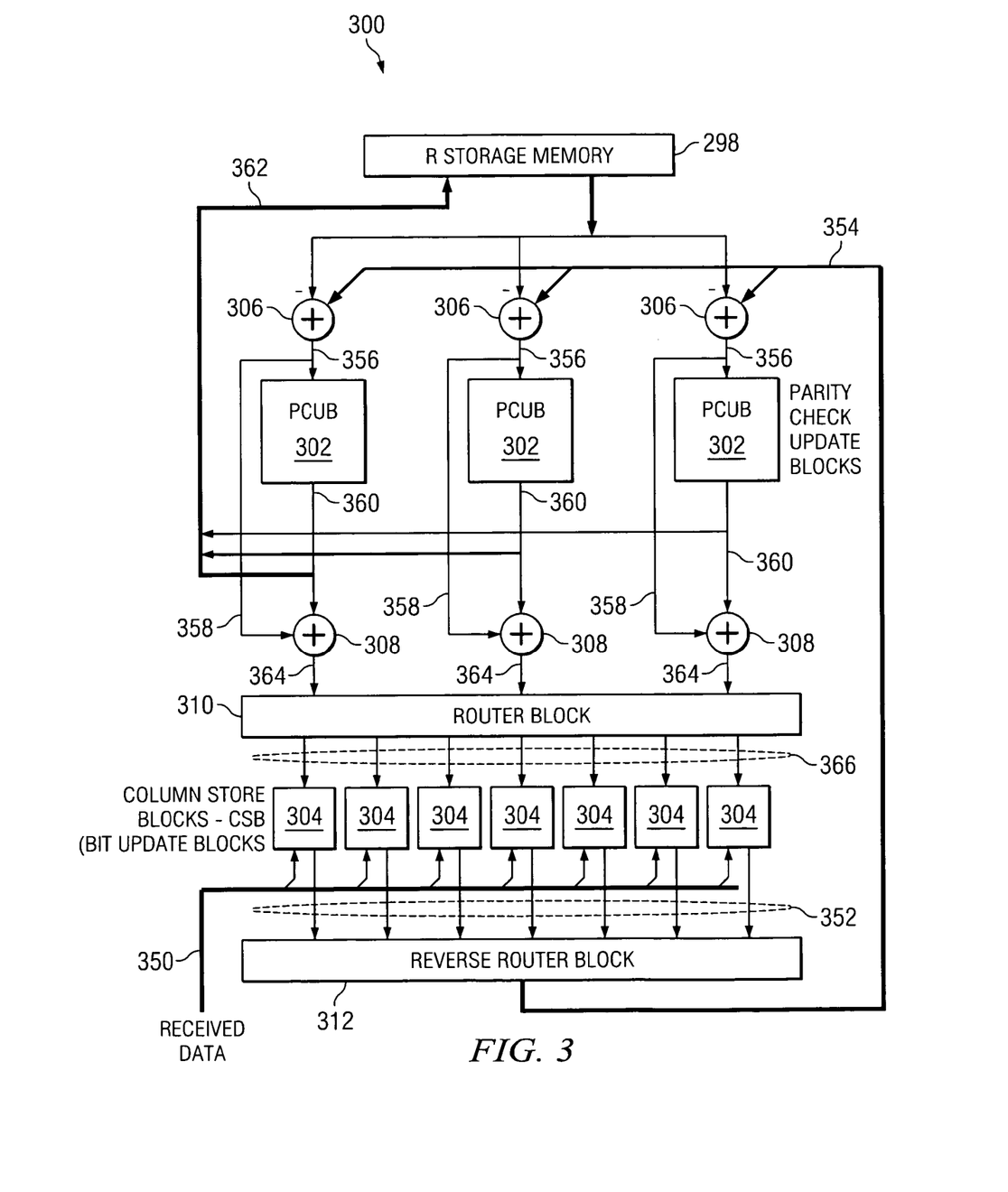
FIG. 3 shows a block diagram of a LDPC decoder architecture in accordance with embodiments of the invention.

FIG. 3 shows a hardware system 300 that may be used to implement the modified algorithm described above. The hardware system 300 comprises a storage memory 298, a plurality of parity check update blocks (PCUBs) 302, a plurality of column store blocks (CSBs) 304, a router block 310, a reverse router block 312, and multiple parallel adder blocks 306 and 308. Received soft data is routed into the system 300 by way of data bus 350. The received soft data is first routed into the CSBs 304, in which the data is initialized to components $L(q_j)$ of vector L, for all values of j, as described above. The vector L is then stored into the CSBs 304. From the CSBs 304, the data is fed into the reverse router block 312 by way of data buses 352, where the data are rearranged as required by the system 300.

Values of vector L, $\hat{L}_j$, then are fed to the parallel adder blocks 306 by way of data bus 354. In the parallel adder blocks 306, for each column, the operation in (5) or a similar operation/approximation is performed, which may include, in at least some embodiments, (13) and (14) or operations/approximations similar to (13) and (14). Specifically, values of $R_{mj}$ are subtracted from values of $\hat{L}_j$. Results of these subtraction operations are fed to the PCUBs 302 as well as the parallel adder blocks 308 by way of buses 356 and 358, respectively. The PCUBs 302 perform operations (6), (9) and (10), or equivalent operations and/or approximations thereof. Results of these operations are routed to the parallel adder blocks 308 by way of buses 360. The results are also routed to the storage memory 298 by way of bus 362. The results are used in the parallel adder blocks 308 to perform (11), which may be part of (13) or (14); that is, the result of the operations in the parallel adder blocks 306 are added to the $R_{mj}$ values calculated in the PCUBs 302, thus producing values $L_{xj}$. These values are fed into the router block 310 using buses 364, which rearranges the values as necessary. Finally, the values may be transferred to the CSBs 304 by way of buses 366 and stored in the CSBs 304 for use in the next iteration.

Figure 4:
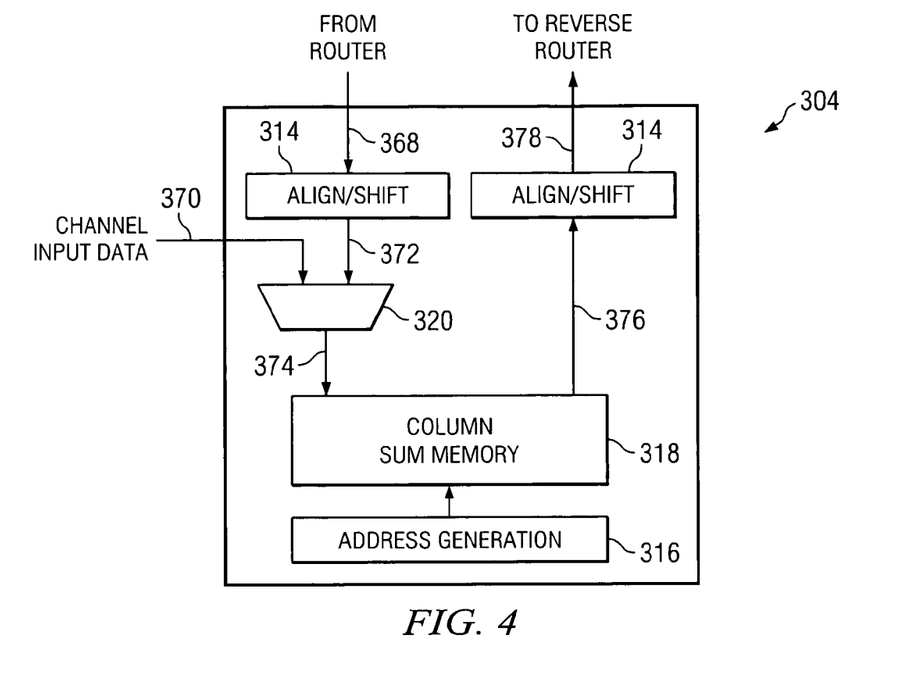
FIG. 4 shows a block diagram of a column sum block.

FIG. 4 shows a detailed view of a CSB 304. The CSB 304 comprises align/shift modules 314, an address generation module 316, a multiplexer 320, and a column sum memory 318. The align/shift modules 314 are not necessarily of an identical structure or composition. Values of the L vector, $L_A$ and/or $L_B$ may be stored in the column sum memory 318. In at least some embodiments, $L_A$ and/or $L_B$ values may be stored separately. As described above, values from the router block 310 may be stored in the CSBs 304. During a write operation, these values are routed into the CSBs 304 by way of buses 368. The align/shift module 314 may be used to arrange the data as desired. The multiplexer 320 may allow passage to either data from the transmission channel by way of bus 370, or data from the router block 310 by way of bus 372. The address generation module 316 may be used to store the data that passes the multiplexer 320 in the column sum memory 318 by way of bus 374. Conversely, during a read operation, data is read from the column sum memory 318 by way of bus 376, passed through the align/shift module 314 to rearrange the data as desired, and passed to the reverse router 312 of FIG. 3 by way of bus 378.

Figure 5A:
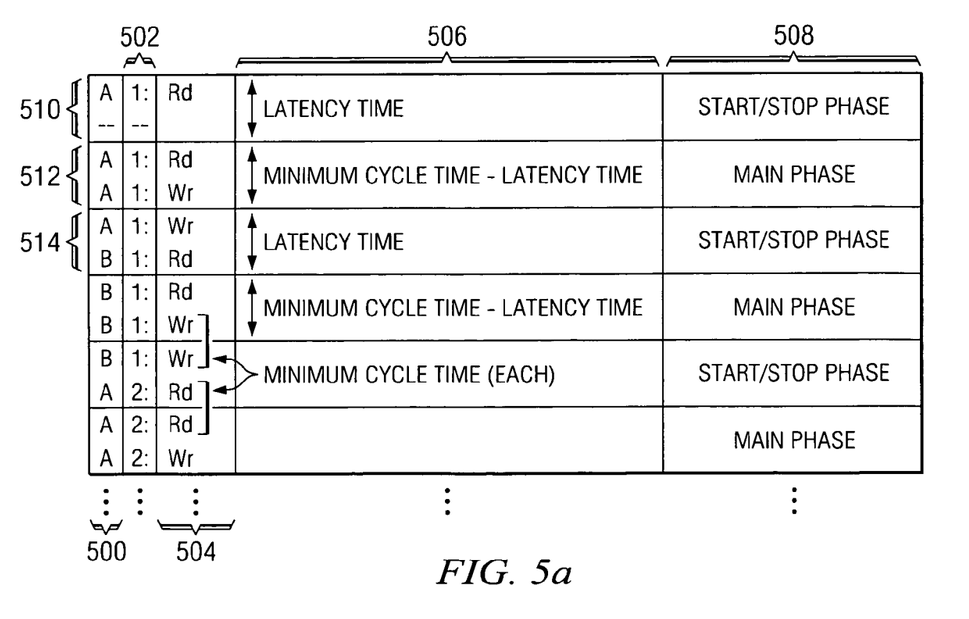
FIGS. 5a and 5b show sequences of phases and memory operations in accordance with embodiments of the invention.

FIG. 5a shows a sequence of processing phases and sequences of memory operations that may occur at the beginning of an iteration for a particular block column without any time gaps. FIG. 5a is divided into five columns. Column 500 shows the segment (i.e., a block row A or B) being processed; column 502 shows an index number of an A or B row with respect to other A or B rows; column 504 shows the action being performed (i.e., read or write); column 506 provides timing information; and column 508 shows whether the process occurs during a start/stop phase or a main phase, both of which are discussed in further detail below.

Phase 510 is a start/stop phase, generally meaning that a read operation is beginning on a next block row while a write operation is being completed for the present block row. In this case, block row A1 is being read from CSB memory 314. However, because phase 510 represents block row A1 (the first block row for this column), no previous write operation is being completed at the time that the read operation begins on block row A1. For this reason, the block row A1 read operation may take up some or all of the start/stop phase 510. The time for this phase is the latency time, which is the time required to go through the full data pipeline (i.e., the time between the point that data leaves the CSB until the data returns).

Phase 512 is a main phase, generally meaning that a substantial portion of a single block row is being processed. Here, block row A1 is being read from memory, and later written to memory. The time for this phase is the difference between the minimum cycle time [p/z] and the latency time. Phase 514 is a start/stop phase that represents the transition from operating on a block row A1 read-step to operating on a block row A1 and B1 as shown. The time required to perform phase 514 is the latency time. Start/stop phases and main phases continue in this manner until all of the block rows of a parity-check macro-matrix have been processed.

Figure 5B:
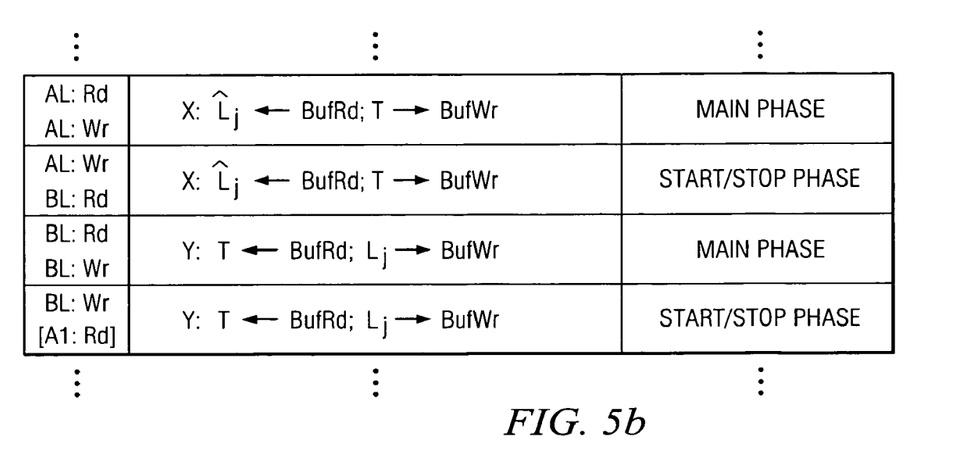
Figure 6:
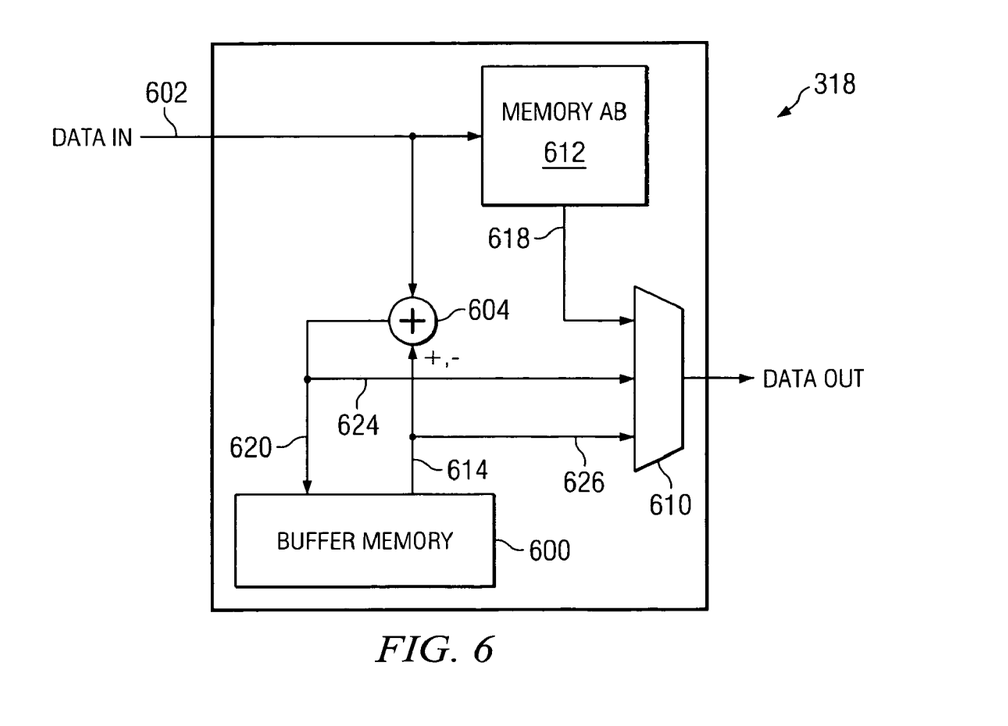
FIG. 6 shows a block diagram of a column sum memory in accordance with embodiments of the invention.

FIG. 5b shows a sequence of phases and memory operations for combining the results of $L_{Aj}$ and $L_{Bj}$ as in operation (15) (i.e., once all of the block rows of a parity check macro-matrix have been processed). FIG. 6 shows a detailed view of a column sum memory 318. The column sum memory 318 comprises a buffer memory 600, an adder block 604, multiplexer 610, and a memory 612. Referring simultaneously to FIGS. 5b and 6, the last block row $B_L$ to be processed is of the block row B grouping. The operations of FIG. 5b marked X and Y are used to calculate (15) in two separate steps. The X step calculates $T_j = L_{Aj} - \hat{L}_j$. The Y step calculates $L_j = L_{Bj} + T_j$. S during the X step, instead of being written into the memory 612, the $L_{Aj}$ data is taken from the incoming data flow on bus 602 and combined with $\hat{L}_j$ data read from the buffer memory 600 via bus 614 at the adder block 604, resulting in a temporary value $T_j$ which is written into memory 600 via bus 620 in place of the $L_{Aj}$ data. During the Y step, instead of being written to memory 612, the $L_{Bj}$ data is taken from the incoming data flow on bus 602 and combined with the temporary value $T_j$ read from the memory 600 via bus 614, resulting in a value $L_j$ which is written into the buffer memory 600 via bus 620. This value $L_j$, as discussed above, then may be used in the following iteration for the next block row in a parity check matrix. Data outputs of the column sum memory 318 may be transferred from a memory 612 output by way of bus 618; outputs of the buffer memory 600 by way of buses 614, 626; inputs to the buffer memory 600 by way of bus 624.

The above discussion is meant to be illustrative of the principles and various embodiments of the present invention. Numerous variations and modifications will become apparent to those skilled in the art once the above disclosure is fully appreciated. For example, numerous other configurations of memories, hardware, supporting logic and operation sequencing can be used to implement either the algorithm(s) presented above, or variations thereof. Solutions involving any number of memories may be used. It is intended that the following claims be interpreted to embrace all such variations and modifications.

What is claimed is:

1. A method of decoding in layers data received in a communication system, comprising:
    receiving a codeword containing a plurality of elements, the codeword encoded according to a low density parity check code represented by a parity check matrix having rows and columns, each of the plurality of elements associated with a column of the parity check matrix, the columns of the parity check matrix corresponding to input nodes and the rows of the parity check matrix corresponding to parity check sums;
    dividing the rows of at least one column of the parity check matrix into groups;
    separately processing each of at least some of the groups by performing a sequence of operations comprising:
        for each row of the group, subtracting a previous check node value from a probability value for each input node contributing to the parity check sum for that row;
        generating a new check node value for that row using the result of the subtracting step; and
        for each input node contributing to the parity check sum for that row, updating a probability value using the new check node value and the result of the subtracting step; and
    then combining the updated probability values of the at least one column from each of the separately processed groups.

2. The method of claim 1, wherein combining is performed during a time period within which substantially no other processes are being performed for said at least one column.

3. The method of claim 1, wherein dividing the rows of the parity check matrix into groups comprises partitioning the at least one column such that at least one block row is in a different group than a next block row.

4. The method of claim 1, wherein the rows of the parity check matrix are grouped into subsets in which each column has a maximum column weight of one.

5. The method of claim 1, wherein the parity check matrix is represented by a macro matrix having zero-valued and non-zero-valued entries arranged in block rows and block columns and in which each zero-valued entry corresponds to a p×p zero-valued matrix and each non-zero-valued entry corresponds to a p×p permutation matrix that has at most a single "1" entry in each row and each column and "0" entries elsewhere to define a parity check matrix.

6. A system for decoding a received signal stream that was encoded according to a low density parity check code represented by a parity check matrix having rows and columns, each of the plurality of elements associated with a column of the parity check matrix, the columns of the parity check matrix corresponding to input nodes, comprising:
    a plurality of parallel computation blocks coupled to a memory;
    a plurality of parity check update blocks (PCUBs) coupled to said computation blocks, for updating check node values corresponding to participating input nodes for a row of the parity check matrix; and
    a plurality of column store blocks (CSBs) coupled to the PCUBs, each CSB comprising a memory for storing an updated probability value corresponding to a plurality of input nodes associated with each of a plurality of rows of the parity check matrix, each of the column store blocks comprising:
        a first memory portion for storing updated probability values for at least one input node associated with a first group of rows;
        a second memory portion for storing updated probability values for at least one input node associated with a second group of rows; and
        circuitry for combining updated probability values from the first and second memory portions for at least one input node.

7. The system of claim 6, wherein the combining circuitry is operable to combine at least some of the probability values for at least one input node during a time period within which the plurality of parity check update blocks and column store blocks are not operating on information associated for for the at least one input node.

* * * * *